(12) United States Patent
Kato

(10) Patent No.: US 8,035,164 B2
(45) Date of Patent: Oct. 11, 2011

(54) SEMICONDUCTOR DEVICE AND ELECTRONIC APPARATUS

(75) Inventor: Tatsushi Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 186 days.

(21) Appl. No.: 12/249,520

(22) Filed: Oct. 10, 2008

(65) Prior Publication Data

US 2009/0101986 A1    Apr. 23, 2009

(30) Foreign Application Priority Data

Oct. 19, 2007    (JP) .................................. 2007-272173

(51) Int. Cl.
*H01L 21/70*    (2006.01)

(52) U.S. Cl. ................ 257/369; 257/295; 257/E27.006; 257/E27.064

(58) Field of Classification Search ................... 257/289, 257/295, 369, E27.006, E27.064
See application file for complete search history.

(56) References Cited

U.S. PATENT DOCUMENTS

| 7,432,542 | B2 | 10/2008 | Ishimaru |
| 7,586,158 | B2 | 9/2009 | Hierlemann et al. |
| 2006/0278903 | A1 * | 12/2006 | Ishimaru ........................ 257/288 |

FOREIGN PATENT DOCUMENTS

| JP | A-63-265463 | 11/1988 |
| JP | A-10-012887 | 1/1998 |
| JP | A-11-087718 | 3/1999 |
| JP | A-2002-217391 | 8/2002 |
| JP | A-2006-339243 | 12/2006 |
| JP | A-2007-19515 | 1/2007 |
| JP | A-2007-194336 | 8/2007 |

OTHER PUBLICATIONS

Sakai et al., "Separation by Bonding Si Islands (SBSI) for LSI Applications;" *Second International SiGe Technology and Device Meeting, Meeting Abstract*; May 2004; pp. 230-231.

Yamazaki et al., Separation by Bonding Si Islands (SBSI) for Advanced CMOS LSI Applications, IEICE Trans. Electron, Apr. 2005, 656-661, vol. E88-C,No. 4, The Institute of Electronics, Information and Communication Engineers, Japan.

Yamazaki et al., Separation by Bonding Si Islands (SBSI) for Advanced CMOS LSIs, Jun. 13-16, 2004, ED 2004, vol. 104,No. 152, The Institute of Electronics, Information and Communication Engineers, Japan.

* cited by examiner

*Primary Examiner* — Thanh V Pham
*Assistant Examiner* — Maria Ligai
(74) *Attorney, Agent, or Firm* — Oliff & Berridge, PLC

(57) ABSTRACT

A semiconductor device includes: a substrate having a first surface; an insulation layer; a semiconductor layer disposed to the first surface of the substrate with the insulation layer interposed between the semiconductor layer and the first surface; and a piezoelectric layer that is positioned between the first surface and the semiconductor layer, and disposed in a region included and interposed in the insulation layer.

4 Claims, 10 Drawing Sheets

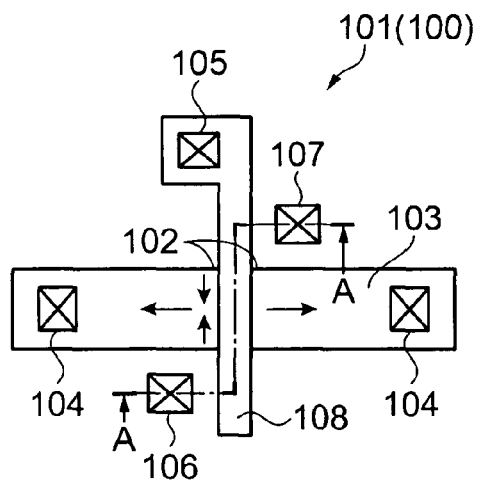
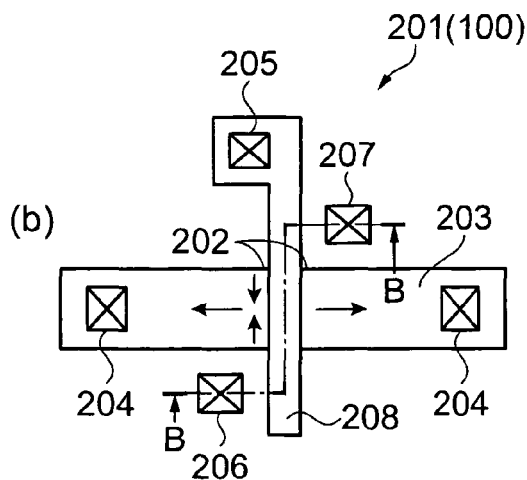
FIG. 1A  FIG. 1B
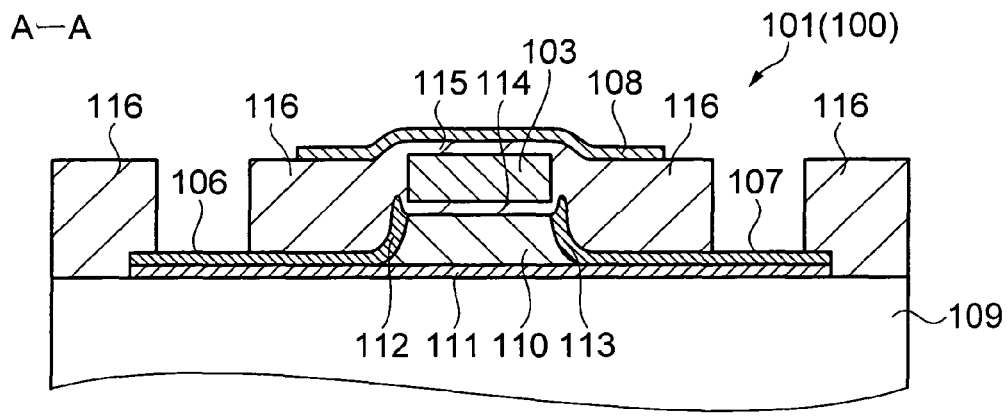
FIG. 1C
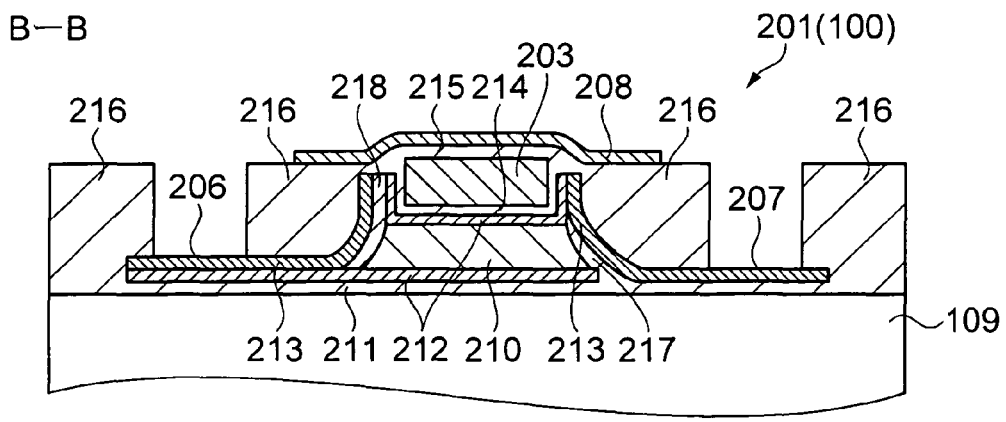
FIG. 1D ional SiGe Technology and Device Meeting, Meeting Abstract, pp. 230-231, May 2004".

SEMICONDUCTOR DEVICE AND ELECTRONIC APPARATUS

The entire disclosure of Japanese Patent Application No. 2007-272173, filed Oct. 19, 2007 is expressly incorporated by reference herein.

BACKGROUND

1. Technical Field

The present invention relates to a semiconductor device, a method for driving a semiconductor device, and an electronic apparatus.

2. Related Art

Recently, in semiconductor fields, techniques have been increasingly developed that form devices to a semiconductor layer (hereinafter referred to as an active layer) on a substrate surface such as a silicon on insulator (SOI). The devices formed on the SOI substrate have possibility of being operated at low voltage, high speed, and low power consumption.

One of the examples of the SOI substrates is a SOI substrate formed by a separation by implanted oxygen (SIMOX) method or a bonding method in which two Si substrates are bonded with an oxide film interposed therebetween. In addition, a technique is known in which the SOI structure is provided by using a separation by bonding silicon island (SBSI) method. In the SBSI method, the SOI structure can be formed to a desired region by typical complementary meta-oxide semiconductor (CMOS) processes instead of providing the SOI structure entirely to a substrate. Such technique is shown in "T. Sakai et al., Second International SiGe Technology and Device Meeting, Meeting Abstract, pp. 230-231, May 2004".

Further, a method is known in which a SiGe layer is formed under an active layer of a SOI substrate, and then a Si layer is overlapped on the SiGe layer and grown to generate strain due to a difference in lattice constants between the SiGe and Si layers. The method is disclosed in JP-A-2007-194336. A technique is also known in which stress is given to a Si crystalline layer serving as an active layer with this strain so as to enhance performances of a CMOS transistor using the Si crystalline layer as a channel.

The method generating stress by using a difference in lattice constants can control the mobility of an active layer by applying strain to the active layer of the SOI substrate, but hardly improves the operation speed of a CMOS transistor, because a strain applying direction differs in a P-channel MOS (PMOS) transistor in which holes play a role in conduction and an N-channel-MOS (NMOS) transistor in which electrons play a role in conduction. In addition, in order to satisfy a high-speed operation and low power consumption simultaneously, it is necessary to enable the following two states to be realized: a high-speed operation in an active state and a low leakage current operation in an idle state. That is, the CMOS transistor needs to operate at high speed and low power consumption. It is difficult for the method applying a constant stress to satisfy the two conditions.

SUMMARY

An advantage of the invention is to provide a semiconductor device capable of a high-speed operation with low power consumption. For expository convenience, the dimension of each layer with respect to a direction leaving from an active surface of a substrate is defined as "thickness".

According to a first aspect of the invention, a semiconductor device includes a substrate having a first surface; an insulation layer; a semiconductor layer disposed to the first surface of the substrate with the insulation layer interposed between the semiconductor layer and the first surface; and a piezoelectric layer that is positioned between the first surface and the semiconductor layer, and disposed in a region included and interposed in the insulation layer.

The device includes the piezoelectric layer between the substrate and the semiconductor layer. Thus, stress can be applied to the semiconductor layer by controlling a voltage applied to the piezoelectric layer. This structure also enables the mobility or band gap, which depends on stress, of the semiconductor layer to be controlled. As a result, a semiconductor device can be provided that can control characteristics of a device formed by using the semiconductor layer with a voltage applied to the piezoelectric layer.

In the semiconductor device, the semiconductor layer and the piezoelectric layer may be disposed to the first surface apart from each other in an island-like shape.

In the device, the semiconductor layer and the piezoelectric layer are disposed apart from each other in the island-like shape. This structure enables stress generated from the piezoelectric layer to be independently applied to each island of the semiconductor layer. As a result, electrical characteristics, which depend on stress, of the semiconductor layer can be independently controlled with respect to each island.

In the semiconductor device, the semiconductor layer may be formed by a separation by bonding silicon island (SBSI) method so as to be disposed in the island-like shape.

In the device, the semiconductor layer (active layer) is formed by using the SBSI method. Accordingly, each island of the semiconductor layer can be formed without any limitations. As a result, each island of the semiconductor layer can be disposed with higher degree of freedom as compared to related techniques.

In the semiconductor device, the semiconductor layer may include a complementary metal-oxide semiconductor (CMOS) transistor, and the piezoelectric layer may include an electrode disposed in a direction of a length of the channel in a plan view seen from a normal line of the first surface, or in a direction of a width of the channel in the plan view seen from the normal line of the first surface, or in a direction of a thickness of the piezoelectric layer so as to sandwich the piezoelectric layer.

In the device, a stress component from the piezoelectric layer is applied to the channel. The stress can be differently applied to each channel from a direction parallel with the semiconductor layer or a direction parallel with the normal line of the semiconductor layer. Thus, stress can be applied to each of the channel of the P-channel MOS (PMOS) transistor and that of the N-channel MOS (NMOS) transistor from different directions. As a result, electrical characteristics that depend on the band structure of the CMOS transistor can be controlled.

According to a second aspect of the invention, a method for driving a semiconductor device that includes: a semiconductor layer disposed to a first surface of a substrate with an insulation layer interposed between the semiconductor layer and the first surface and having a channel of a P-channel metal-oxide semiconductor (PMOS) transistor; and a piezoelectric layer that is positioned between the first surface and the semiconductor layer and disposed in a region included and interposed in the insulation layer, includes: applying a compression stress in a direction of a width of the channel in a plan view seen from a normal line of the first surface in a case where the PMOS transistor is in an active state; and applying a tensile stress in the channel width direction in a case where the PMOS transistor is in an idle state.

The method can realize a high-speed operation by increasing a saturated current in an active state while can lower the driving power by reducing an off leak current in an idle state. The operation is not yet fully theoretically explained. The following model, however, is proposed.

When a compression stress is applied, a degenerate band in a valence band of a semiconductor layer included in a PMOS transistor is separated, and light holes having a small effective mass are formed. The small effective mass can realize a high-speed operation even though in a weak electric field. In contrast, when a tensile stress is applied, a band gap in the semiconductor layer is widened, so that an off leak current due to interband transition is suppressed. It is considered that this mechanism can realize a high-speed operation and low power consumption.

According to a third aspect of the invention, a method for driving a semiconductor device that includes: a semiconductor layer disposed to a first surface of a substrate with an insulation layer interposed between the semiconductor layer and the first surface and having a channel of an N-channel metal-oxide semiconductor (NMOS) transistor; and a piezoelectric layer that is positioned between the first surface and the semiconductor layer and disposed in a region included and interposed in the insulation layer, includes: applying a tensile stress in a direction of a length of the channel in a case where the NMOS transistor is in an active state; and applying a compression stress in the channel length direction in a case where the NMOS transistor is in an idle state.

The method can realize a high-speed operation by increasing a saturated current in an active state while can lower the driving power by reducing an off leak current in an idle state. The operation is not yet fully theoretically explained. The following model, however, is proposed.

When a tensile stress is applied, a degenerate band in a valence band of a semiconductor layer included in an NMOS transistor is separated, and light electrons having a small effective mass are formed. The small effective mass can realize a high-speed operation even though in a weak electric field. In contrast, when a compression stress is applied, a band gap in the semiconductor layer is widened, so that an off leak current due to interband transition is suppressed. It is considered that this mechanism can realize a high-speed operation and low power consumption.

According to a fourth aspect of the invention, an electronic apparatus includes the semiconductor device described above.

As a result, an electronic apparatus capable of a high-speed operation with low power consumption can be provided because of the semiconductor device therein.

BRIEF DESCRIPTION OF THE DRAWINGS

The invention will be described with reference to the accompanying drawings, wherein like numbers reference like elements.

FIG. 1A is a plan view of a PMOS transistor.
FIG. 1B is a plan view of an NMOS transistor.
FIG. 1C is a sectional view of the PMOS transistor.
FIG. 1D is a sectional view of the NMOS transistor.

DESCRIPTION OF EXEMPLARY EMBODIMENTS

Figure 2:
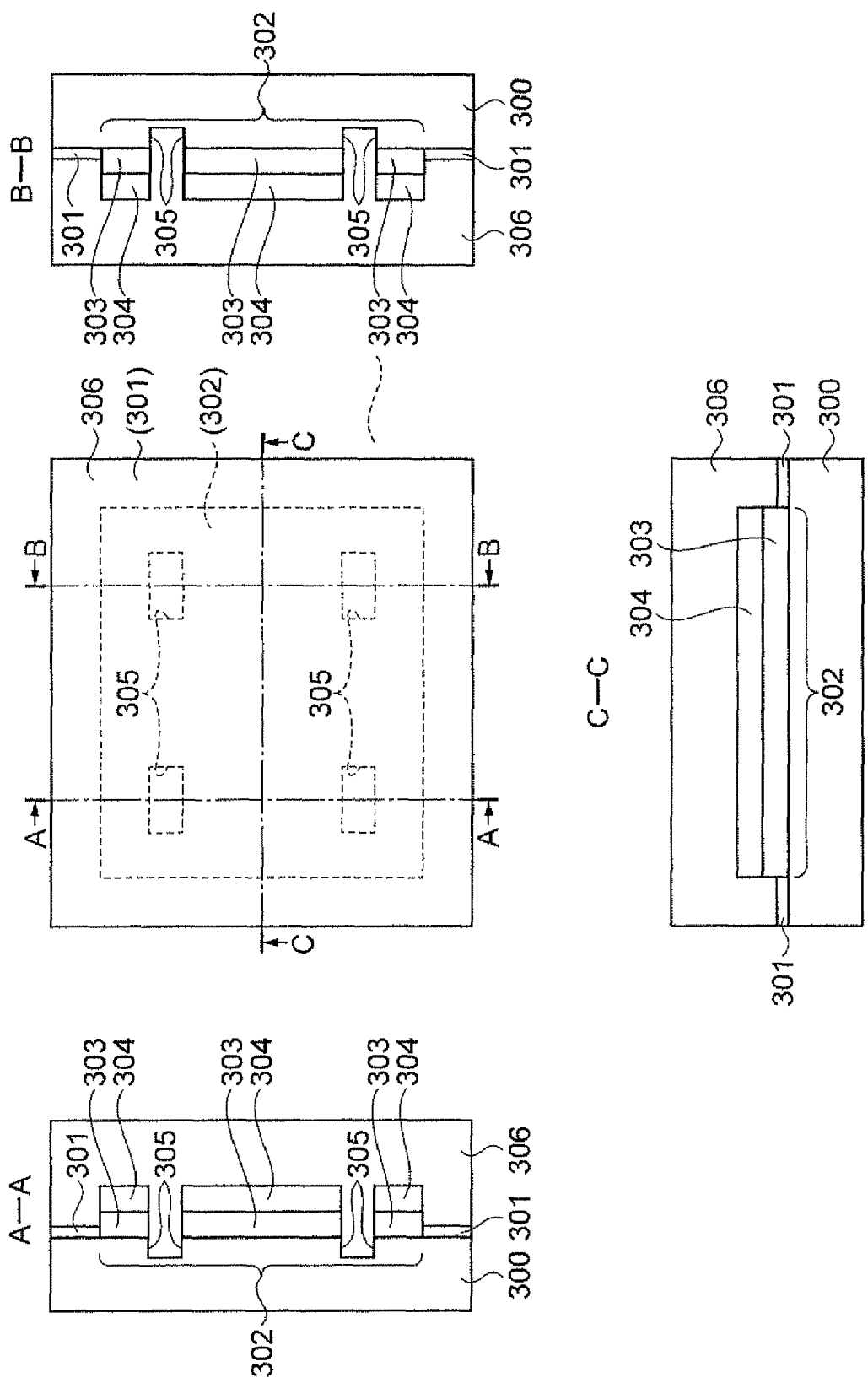
FIG. 2 shows a plan view and sectional views for explaining a manufacturing method according to an embodiment of the invention.

CMOS Transistor on SOI Element Including Piezoelectric Layer

A CMOS transistor according to an embodiment of the invention will be described with reference to accompanying drawings. The CMOS transistor is formed on a SOI layer including a piezoelectric layer.

FIG. 1A is a plan view of a PMOS transistor 101 according to the embodiment. FIG. 1B is a plan view of an NMOS transistor 201 according to the embodiment. The PMOS transistor 101 and the NMOS transistor 201 are included in a CMOS transistor 100. FIG. 1C is a sectional view taken along the line A-A of the PMOS transistor 101. FIG. 1D is a sectional view taken along the line B-B of the NMOS transistor 201.

The PMOS transistor 101 includes a semiconductor layer 103 having a channel portion 102 and serving as an active layer, source/drain contacts 104, piezoelectric layer driving contacts 106 and 107, and a gate electrode 108, as shown in FIG. 1A. The piezoelectric layer is made of lead zirconium titanate (hereinafter referred to as PZT), for example. The piezoelectric layer has (100) orientation. The PMOS transistor 101 further includes a substrate 109, a piezoelectric layer 110, a first separation layer 111 separating the substrate 109 and the piezoelectric layer 110, a first conducting portion 112 and a second conducting portion 113 both of which give potential to the piezoelectric layer 110, a second separation layer 114 separating the semiconductor layer 103 and the piezoelectric layer 110, a gate insulation layer 115, and a third separation layer 116 to fill gaps, as shown in FIG. 1C.

The piezoelectric layer 110 can apply stress in a direction parallel with the substrate 109 in the PMOS transistor 101. Potential is applied between the source/drain contacts 104 while stress is being applied. Potential applied to a gate contact 105 is transferred to the gate electrode 108 to enable a current flowing in the channel portion 102 to be controlled. The behavior of a current under a state in which stress is applied will be described later (in Method for Driving SOI-CMOS Transistor Including Piezoelectric Layer).

The NMOS transistor 201 includes a semiconductor layer 203 having a channel portion 202 and serving as an active layer, source/drain contacts 204, piezoelectric layer driving contacts 206 and 207, and a gate electrode 208, as shown in FIG. 1B. The piezoelectric layer is made of PZT, for example. The NMOS transistor 201 further includes the substrate 109, a piezoelectric layer 210, a first separation layer 211 separating the substrate 109 and the piezoelectric layer 210, a first conducting portion 212 and a second conducting portion 213 both of which give potential to the piezoelectric layer 210, a second separation layer 214 separating the semiconductor layer 203 and the piezoelectric layer 210, a gate insulation layer 215, and a third separation layer 216 to fill gaps, a fourth separation layer separating the first conducting portion 212 and the second conducting portion 213, and a fifth separation layer 218 separating the second conducting portion 213 and the first conducting portion 212, as shown in FIG. 1D.

The piezoelectric layer 210 can apply potential in a direction perpendicular to the substrate 109. Potential is applied between the source/drain contacts 204 while stress is being applied. Potential applied to a gate contact 205 is transferred to the gate electrode 208 to enable a current flowing in the channel portion 202 to be controlled. The behavior of a current under a state in which stress is applied will be described later (in Method for Driving SOI-CMOS Transistor Including Piezoelectric Layer).

The major dimensions of the PMOS transistor 101 are exemplified as follows. The thickness of the semiconductor layer 103 of the PMOS transistor 101 is 0.1 µm. The width in a direction along the gate electrode 108 (a direction perpendicular to the channel portion 102) is 1.2 µm. The length in a direction perpendicular to the gate electrode 108 is 3.8 µm. The thickness of the gate insulation layer 115 is 10 nm. The length of the channel portion 102 is 0.6 µm. The width of the channel portion 102 is 1.2 µm.

The same values of the dimensions of the PMOS transistor 101 can be applied to those of the NMOS transistor 201. The width of the channel portion 202 of the NMOS transistor 201 may be narrowed than that of the channel portion 102 of the PMOS transistor 101 to fit in with the current supply capacity of the PMOS transistor 101 having the capacity lower than the NMOS transistor 201. In this cases the ON/OFF switching characteristic of the CMOS transistor 100 can be controlled with high balance.

The semiconductor layers 103 and 203 that are included in the CMOS transistor 100, preferably have a face direction of <100>. Because of having the face direction, the electrical characteristics notably vary according to stress applied by the piezoelectric layers 110 and 210. In addition, the substrate 109 preferably has the face direction of <100> because the semiconductor layers 103 and 203 are formed so that the face direction of the substrate 109 is transferred when the semiconductor layers 103 and 203 are formed by using an SBSI method. In the embodiment, the channel portions 102 and 202 face a <110> direction.

In the embodiment, an example is described in which stress is applied in the direction parallel with the substrate 109 in the PMOS transistor 101 while stress is applied in the direction perpendicular to the substrate 109 in the NMOS transistor 201. The direction in which stress is applied is, however, not limited to the above example. For example, stress may be applied in the direction perpendicular to the substrate 109 in the PMOS transistor 101 while in the direction parallel with the substrate 109 in the NMOS transistor 201.

Method for Driving SOI-CMOS Transistor Including Piezoelectric Layer

A method according to another embodiment of the invention will be described with reference to the accompanying drawings. A case in which the transistor is in an active state will be described. Potential is applied from the piezoelectric layer driving contacts 106 and 107 shown in FIG. 1A to the piezoelectric layer 110 shown in FIG. 1C to generate strain so that a compression stress is applied to the channel portion 102 in a channel length direction thereof while a tensile stress is applied in a width direction thereof in the PMOS transistor 101. The tensile stress is generated as a result of the applied compression stress. The applied stress enhances the current driving capacity of the PMOS transistor 101. As a result, the enhanced capacity allows load capacitances and stray capacitances to be rapidly charged and discharged, enabling a high-speed operation. The mechanism of characteristics being varied is not theoretically established. It is presumed that a band structure of the channel portion 102 located in the semiconductor layer 103 varies so as to reduce an effective mass of a hole to narrow a band gap.

The NMOS transistor 201 shown in FIG. 1B also can operate in the same manner while the stress direction is different from that in the PMOS transistor 101. In this case, potential is applied from the piezoelectric layer driving contacts 206 and 207 to the piezoelectric layer 210 shown in FIG. 1D to generate strain so that a tensile stress is applied to the channel portion 202 in a channel length direction and a width direction thereof in the NMOS transistor 201. The applied stress enhances the current driving capacity of the NMOS transistor 201. As a result, the enhanced capacity allows load capacitances and stray capacitances to be rapidly charged and discharged, enabling a high-speed operation.

As described above, the current driving capacities of the PMOS transistor 101 shown in FIG. 1A and the NMOS transistor 201 shown in FIG. 1B are enhanced. The enhanced capacity enables load capacitances and stray capacitances to be rapidly charged and discharged. As a result, the CMOS transistor 100 can be provided that can operate in high speed.

A case in which the transistor is in an idle state will be described. Potential is applied from the piezoelectric layer driving contacts 106 and 107 to the piezoelectric layer 110 shown in FIG. 1C to generate strain so that a tensile stress is applied to the channel portion 102 shown in FIG. 1A in the channel length direction thereof while a compression stress is applied in the width direction thereof in the PMOS transistor 101. Specifically, the condition can be realized by applying potential to the piezoelectric layer driving contacts 106 and 107 in a direction opposite to that in the active state. The applied stress enables a leakage current to be suppressed. As a result, a low power operation can be achieved.

The NMOS transistor 201 also can operate in the same manner. In this case, potential is applied from the piezoelectric layer driving contacts 206 and 207 to the piezoelectric layer 210 shown in FIG. 1D to generate strain so that a compression stress is applied to the channel portion 102 in the channel length direction and the width direction thereof in the NMOS transistor 210 shown in FIG. 1B. Specifically, the condition can be realized by applying potential to the piezoelectric layer driving contacts 206 and 207 in a direction opposite to that in the active state. The applied stress enables the leakage current of the NMOS transistor 201 to be suppressed. As a result, a low power operation can be achieved.

Consequently, the leakage current of the CMOS transistor 100 composed of the PMOS transistor 101 and the NMOS transistor 201 can be suppressed, enabling a low power operation.

As described above, the piezoelectric layers 110 and 210 (shown in FIGS. 1C and 1D respectively) disposed in the CMOS transistor 100 allow stress applied to the channel portions 102 and 202 to be controlled, enabling a high-speed operation and a low power operation to be switched and controlled.

In the embodiment, an example is described in which both the piezoelectric layers 110 and 210 are disposed in the CMOS transistor 100. However, either one of them may be disposed, which can simplify the manufacturing process.

Method for Manufacturing SOI-CMOS Transistor Including Piezoelectric Layer

A method for manufacturing a SOI-CMOS transistor according to still another embodiment of the invention will be exemplified with reference to the accompanying drawings. The transistor is fabricated by an SBSI method and includes a piezoelectric layer. In the description of the method, much emphasis is placed on the description on a step to fabricate the piezoelectric layer. In the drawings, the structures are shown by being enlarged in the thickness direction because it is difficult to see the structures in the thickness direction if they are shown based on the actual ratio. In particular, it is noted that a buffer layer 303 and a semiconductor layer 304 have a large film-like structure in which the thickness extends in a lateral direction (e.g. refer to FIG. 2). In addition, the aspect ratio differs in every drawing to enhance visibility.

First, a substrate 300 made of single-crystalline silicon is cleaned. The substrate 300 is oxidized by a thermal oxidation method to form a protective layer 301 made of oxidized silicon.

Then, the protective layer 301 is opened to form an epi-region 302.

Next, the buffer layer 303 having a composition of $Si_{0.63}Ge_{0.37}$ is formed by a selective epitaxial growing condition under which a single-crystalline is formed on the epi-region 302 while nothing is formed on the protective layer 301. Subsequently, the semiconductor layer 304 serving as an active layer is formed. In this case, the semiconductor layer 304 can be formed as a single-crystalline layer.

Then, a supporting hole 305 to support a supporter 307 (shown in FIG. 3) is formed. Next, a supporter precursor layer 306 made of silicon oxide is formed by using a chemical vapor deposition (CVD) method. The supporting hole 305 is formed to the substrate 300 so as to penetrate to a certain depth in order to prevent the supporter 307 from being peeled off in etching the buffer layer 303, which will be described later.

FIG. 2 shows the structure having been formed by the steps described above.

The structure shown in FIG. 2 is further processed as follows. The supporter precursor layer 306 is processed with a resist pattern 308 formed by photolithography, so that the supporter 307 is formed in a PMOS region 309 and an NMOS region 310. In this process, the substrate 300 is also etched so that the side surface of the supporter 307 is formed so as to expose the buffer layer 303 for removing the buffer layer 303 in an etching step described later.

Then, the buffer layer 303 is etched so that the semiconductor layer 304 is supported by the supporter 307 at a position apart from the substrate 300.

Figure 3:
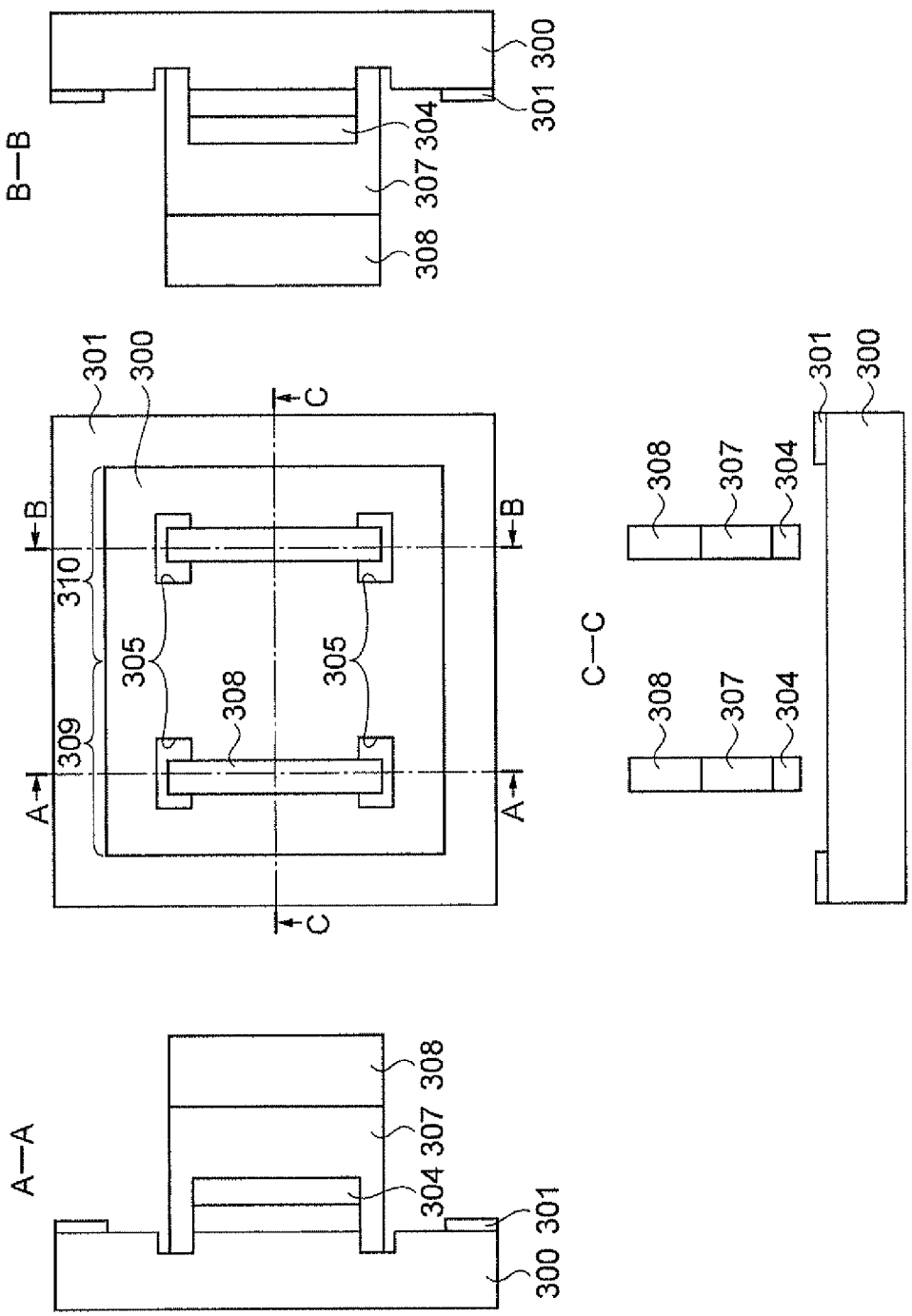
FIG. 3 shows a plan view and sectional views for explaining a manufacturing method according to the embodiment of the invention.

FIG. 3 shows the structure having been formed by the steps described above.

The structure shown in FIG. 3 is further processed as follows. The resist pattern 308 is removed, and then the substrate 300 is thermally oxidized to form an insulation layer 311.

Next, a mask layer 312 is formed by using a CVD method. For the mask layer 312, silicon nitride can be used. Then, the PMOS region 309 is covered with a resist pattern 313 formed by photolithography. Next, the mask layer on the NMOS region 310 is wet-etched by using thermal phosphoric acid, for example.

Figure 4:
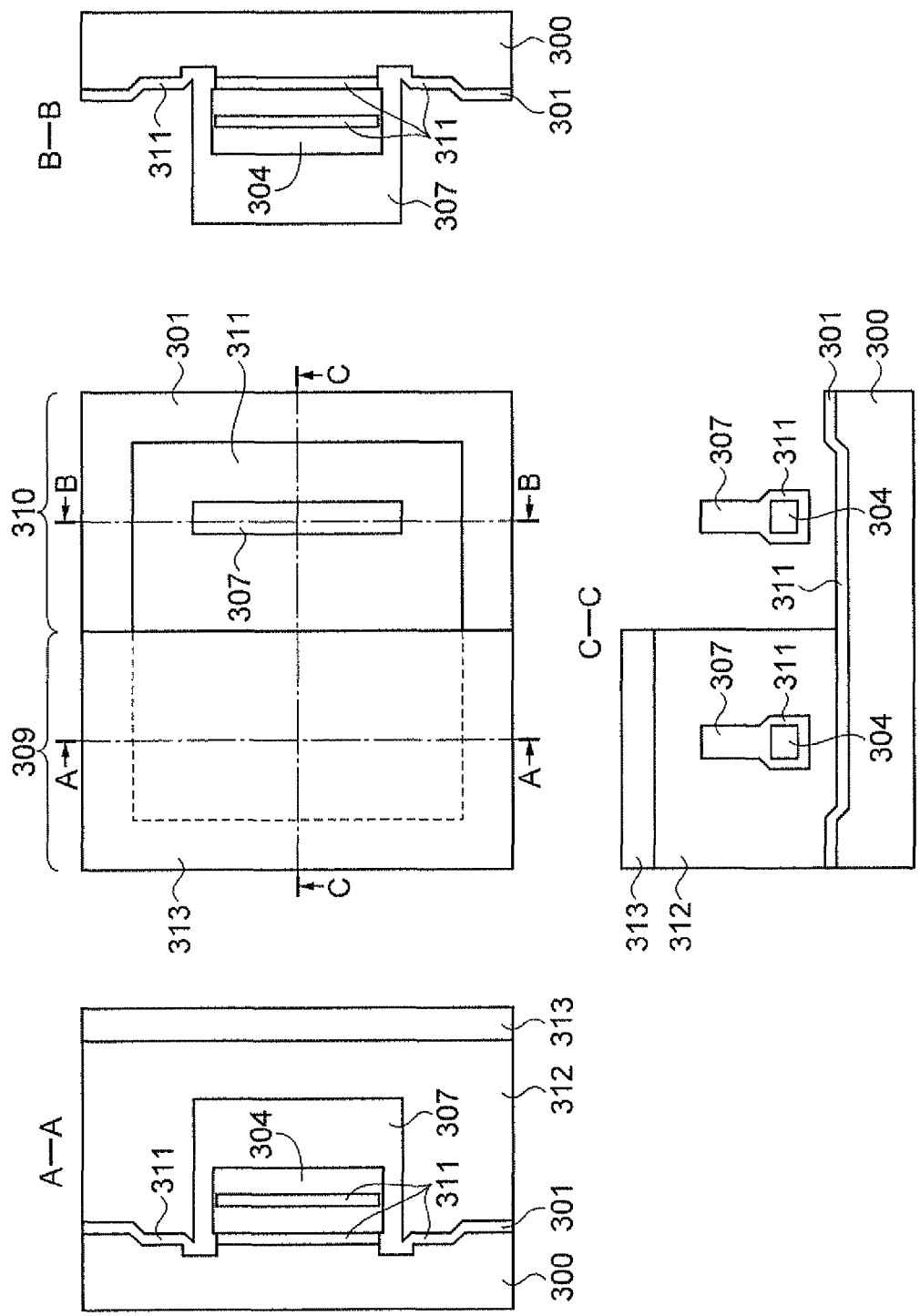
FIG. 4 shows a plan view and sectional views for explaining a manufacturing method according to the embodiment of the invention.

FIG. 4 shows the structure having been formed by the steps described above.

The structure shown in FIG. 4 is further processed as follows. The resist pattern 313 is removed. Then, an electrode layer 314 is formed. The electrode layer 314 is made of $SrRuO_3$ formed by using a metal organic chemical vapor deposition (MOCVD) method. Next, the electrode layer 314 is wet-etched by photolithography so that a region sandwiched by the electrode layers 314, in the NMOS region 310, remains.

Figure 5:
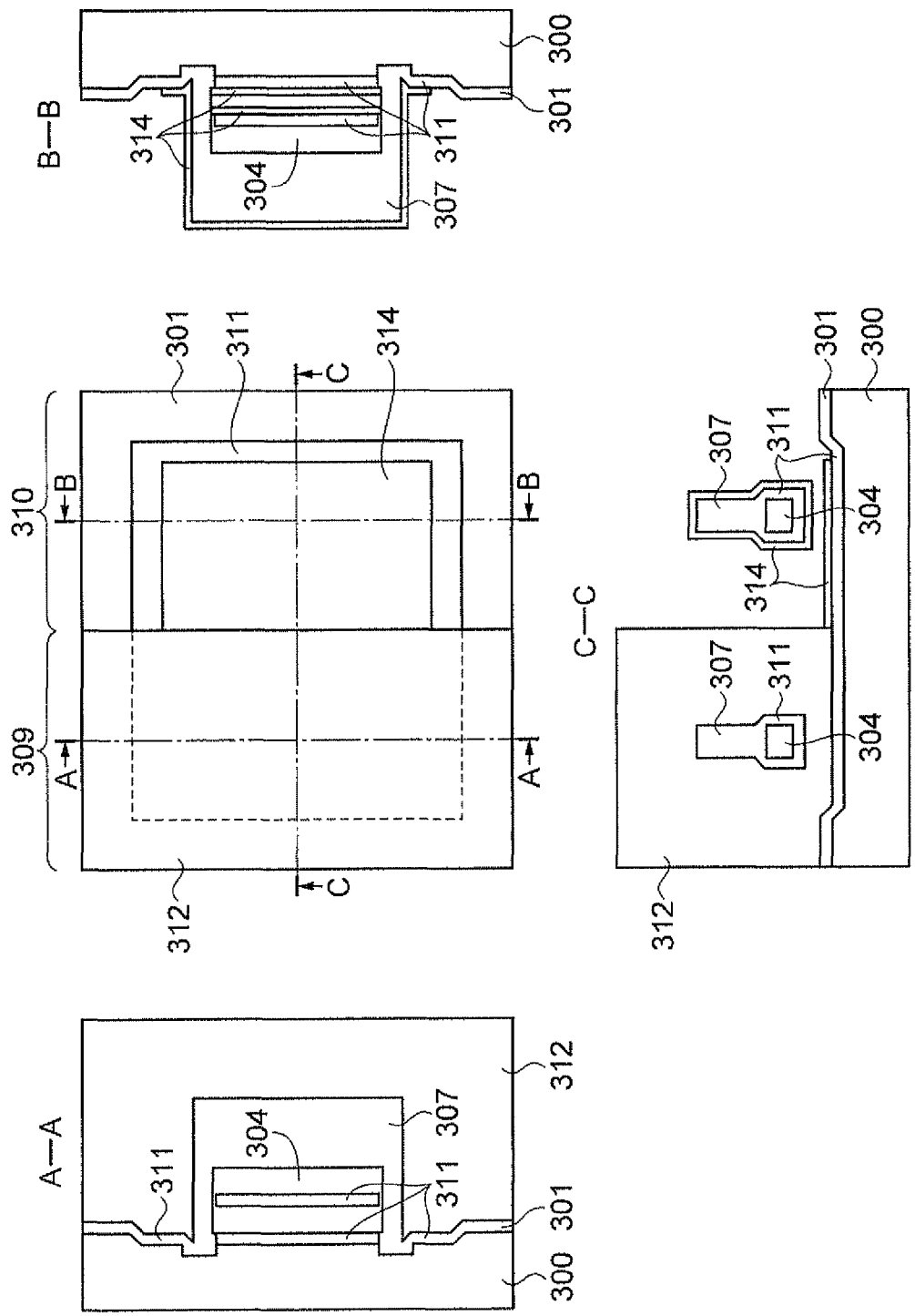
FIG. 5 shows a plan view and sectional views for explaining a manufacturing method according to the embodiment of the invention.

FIG. 5 shows the structure having been formed by the steps described above.

The structure shown in FIG. 5 is further processed as follows. The mask layer 312 in the PMOS region 309 is wet-etched by using thermal phosphoric acid, for example. Then, a PZT-sol is filled and dried at 150 degrees centigrade for about 5 minutes to form a piezoelectric layer precursor 315.

Figure 6:
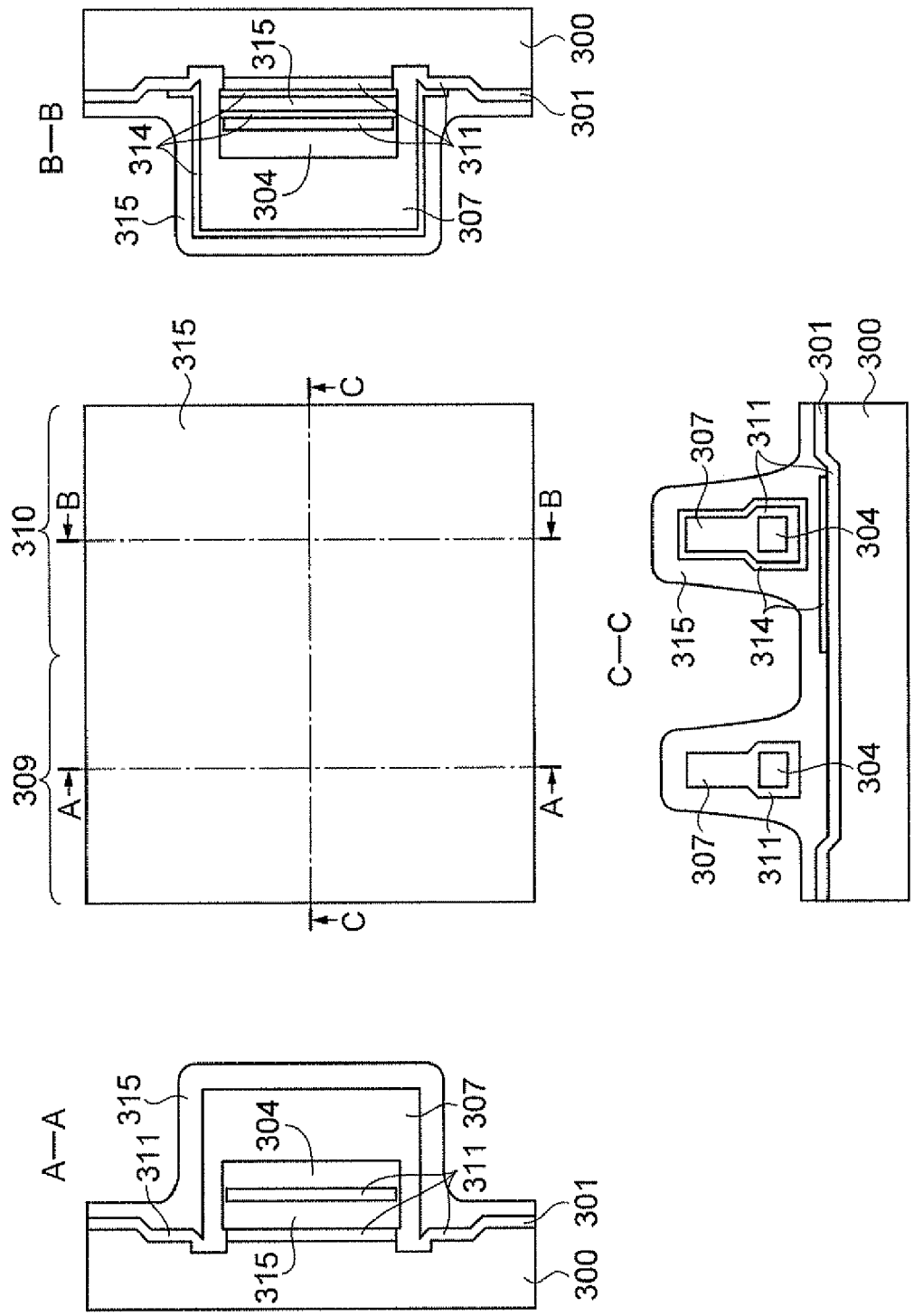
FIG. 6 shows a plan view and sectional views for explaining a manufacturing method according to the embodiment of the invention.

FIG. 6 shows the structure having been formed by the steps described above.

The structure shown in FIG. 6 is further processed as follows. The piezoelectric layer precursor 315 is wet-etched and annealed at about 700 degrees centigrade for about 30 minutes in an oxidation atmosphere to form a piezoelectric layer 316. Here, wet-etching after dry etching (anisotropic) may be carried out instead of single wet-etching. In this case, the piezoelectric layer 316 can be formed with high repeatability.

Figure 7:
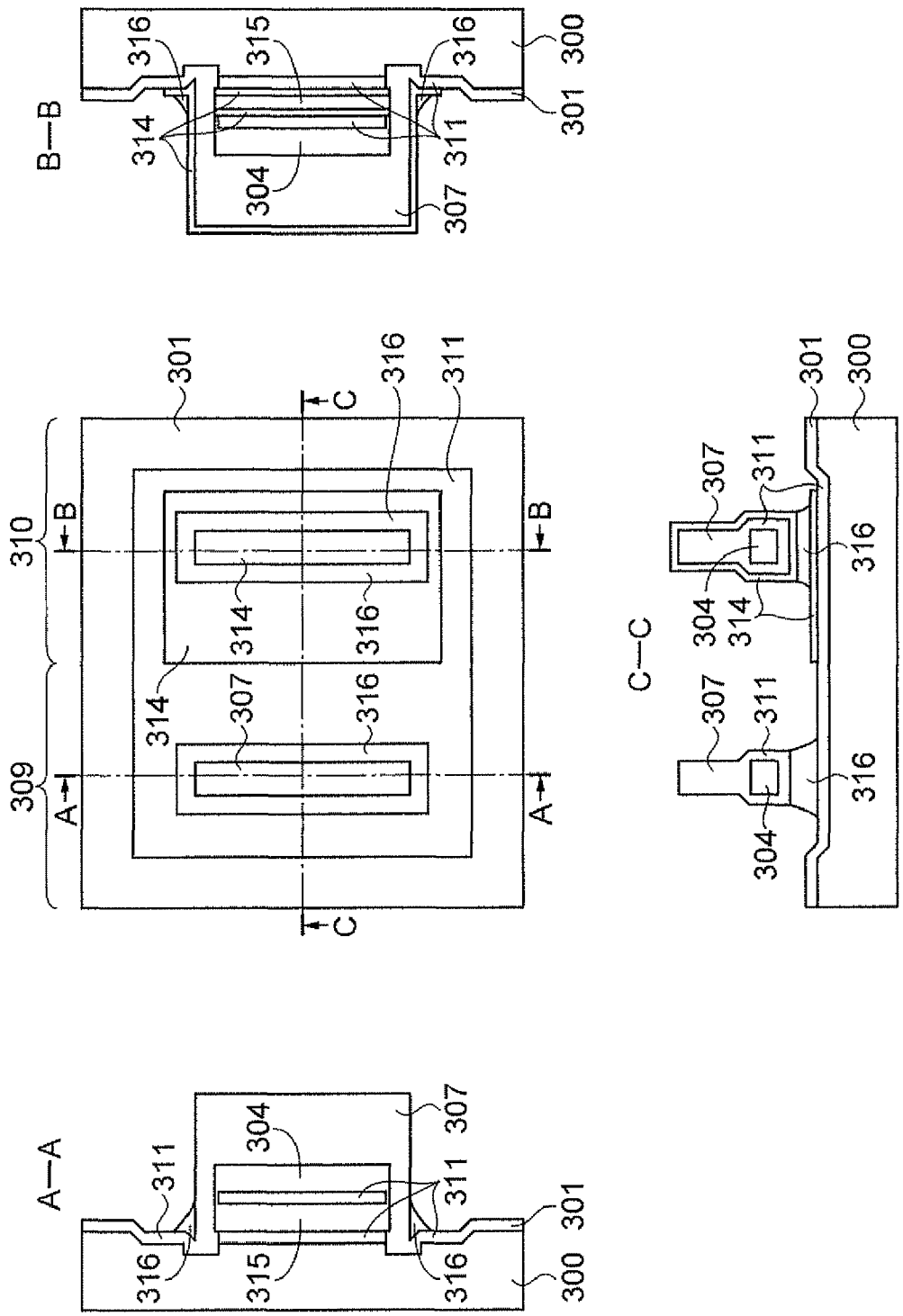
FIG. 7 shows a plan view and sectional views for explaining a manufacturing method according to the embodiment of the invention.

FIG. 7 shows the structure having been formed by the steps described above.

The structure shown in FIG. 7 is further processed as follows. An electrode separation layer precursor 317 is formed by a vapor deposition method. The electrode separation layer precursor 317 can be formed with silicon nitride. Since coverage property is low in the vapor deposition method, the thickness of the electrode separation layer precursor 317 deposited in the side surface direction of the structure formed on the substrate 300 (the surface direction of the substrate 300) can be suppressed.

Then, the electrode separation layer precursor 317 is wet-etched to expose the side surface of the insulation layer 311. Next, a part of the supporter 307 in the NMOS region 310 is covered with a resist pattern 318 formed by photolithography. Then, the electrode separation layer precursor 317 is wet-etched to form an electrode separation layer 319.

Figure 8:
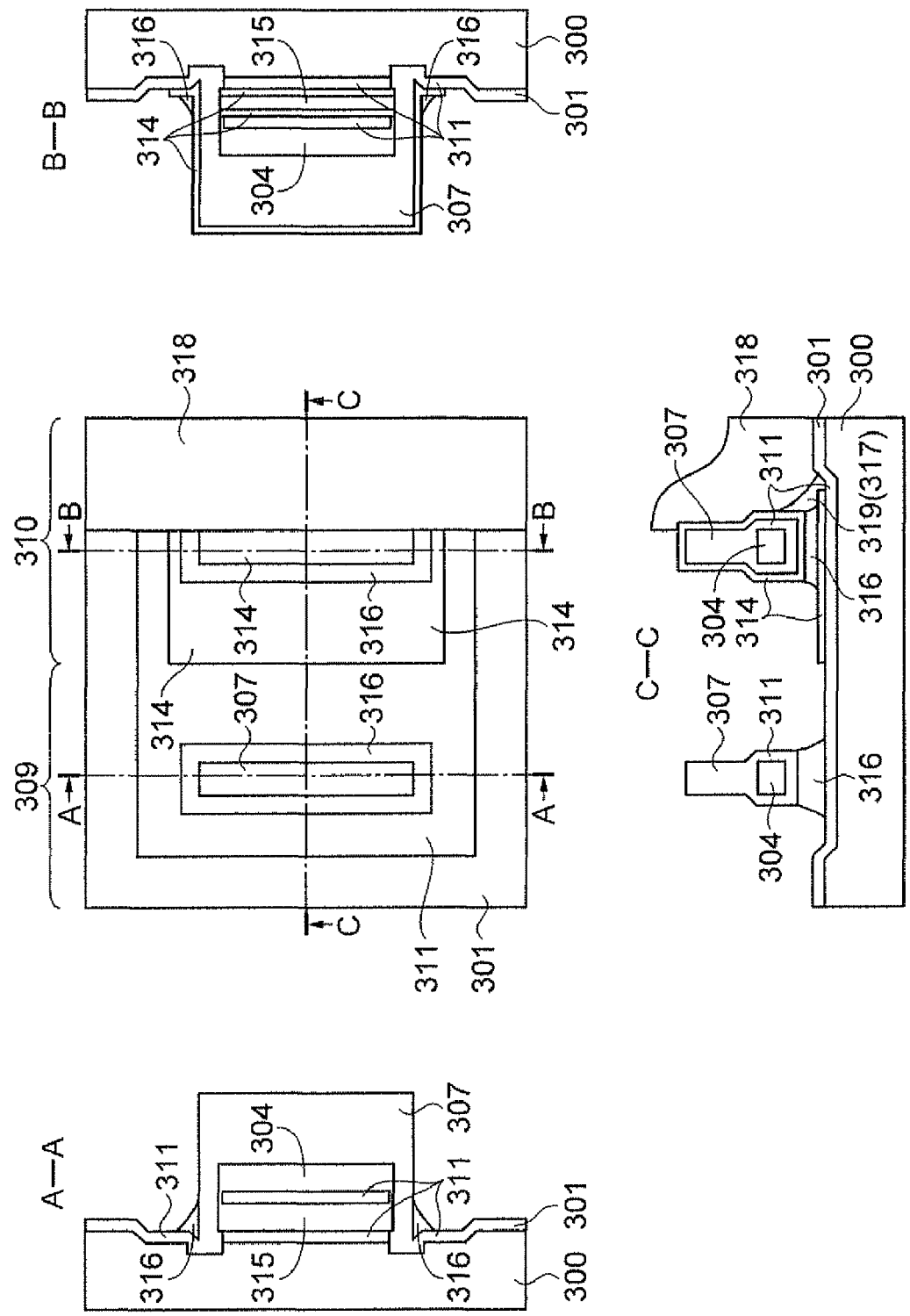
FIG. 8 shows a plan view and sectional views for explaining a manufacturing method according to the embodiment of the invention.

FIG. 8 shows the structure having been formed by the steps described above.

The structure shown in FIG. 8 is further processed as follows. The resist pattern 318 is removed. Then, a silicon nitride layer is formed. Subsequently, an electrode separation layer 340 is formed by photolithography and etching. Then, an electrode layer 320 is formed. The electrode layer 320 is made of $SrRuO_3$ formed by using a MOCVD method. Subsequently, the electrode layers 314 and 320 are separated by photolithography and etching. Next, an interlayer insulation layer 322 is formed by a CVD method, for example. For the interlayer insulation layer 322, silicon oxide can be used. Next, the interlayer insulation layer 322 is planarized by using a chemical mechanical polishing (CMP) method, and the electrode layer 320 is light-etched. As a result, the piezoelectric layer 316 can be formed that can apply stress to the semiconductor layer 304 in a direction parallel with the semiconductor layer 304 in the PMOS region while in a direction perpendicular to the semiconductor layer 304 in the NMOS region.

Figure 9:
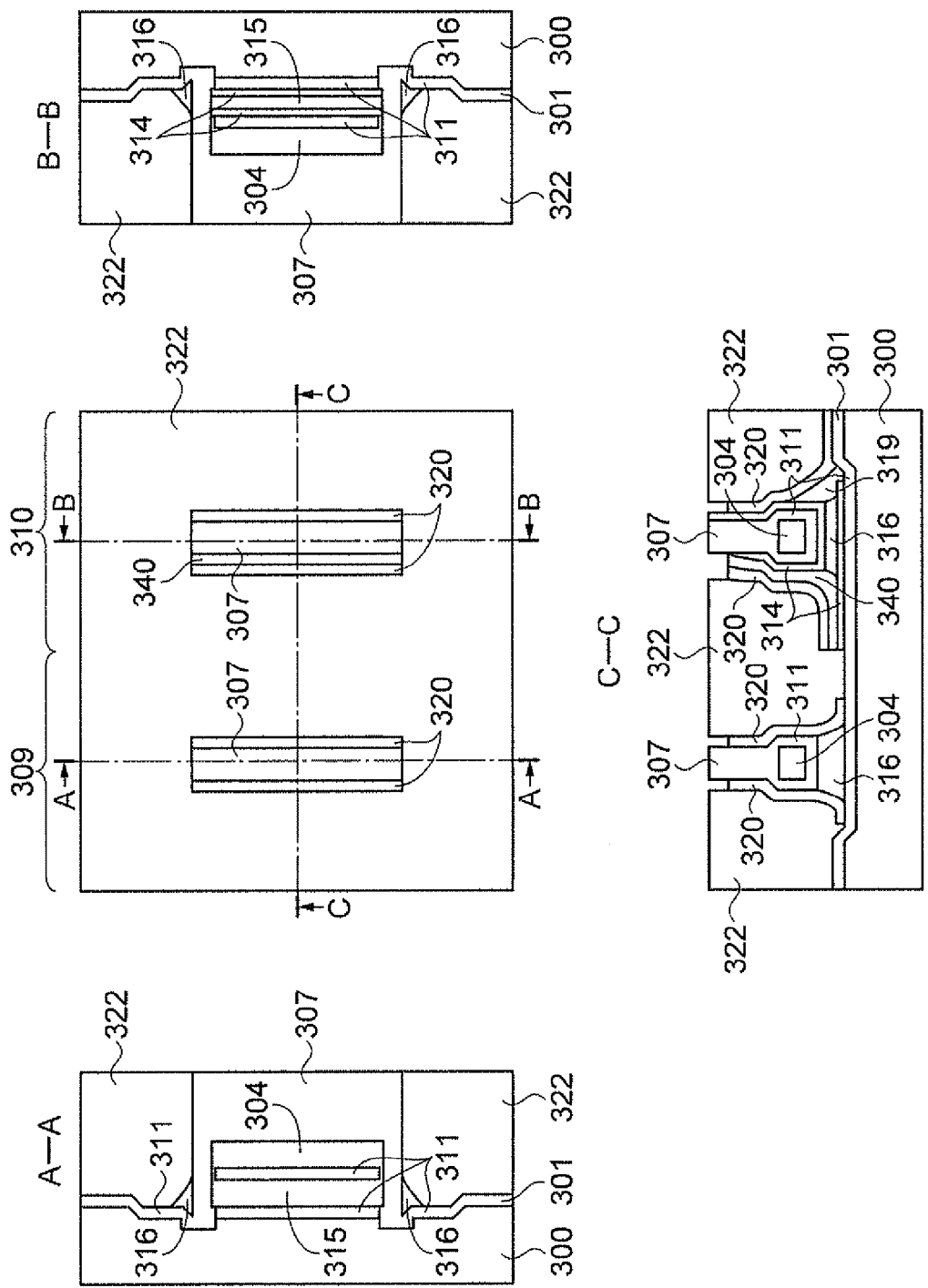
FIG. 9 shows a plan view and sectional views for explaining a manufacturing method according to the embodiment of the invention.

FIG. 9 shows the structure having been formed by the steps described above.

With the semiconductor layer 304, the PMOS transistor 101 shown in FIG. 1A and the NMOS transistor 201 shown in FIG. 1B can be formed. As a result, the CMOS transistor 100 can be formed.

Examples Applied to Electronic Apparatuses

Figure 10A:
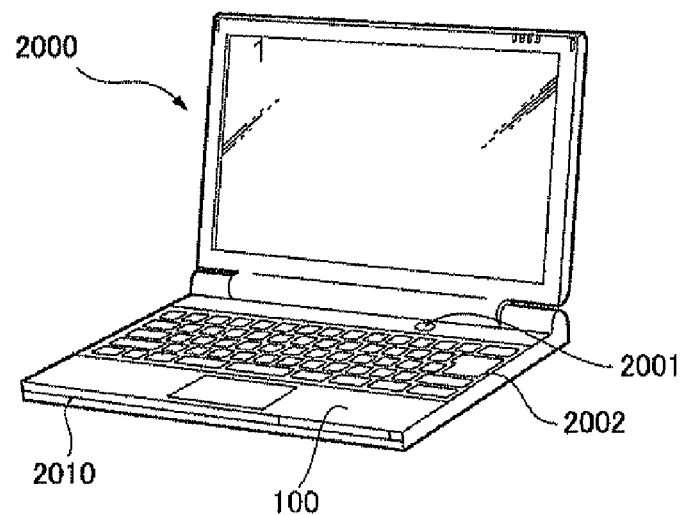
FIGS. 10A to 10C are schematic views illustrating examples of electric apparatuses including a CMOS transistor.
Figure 10B:
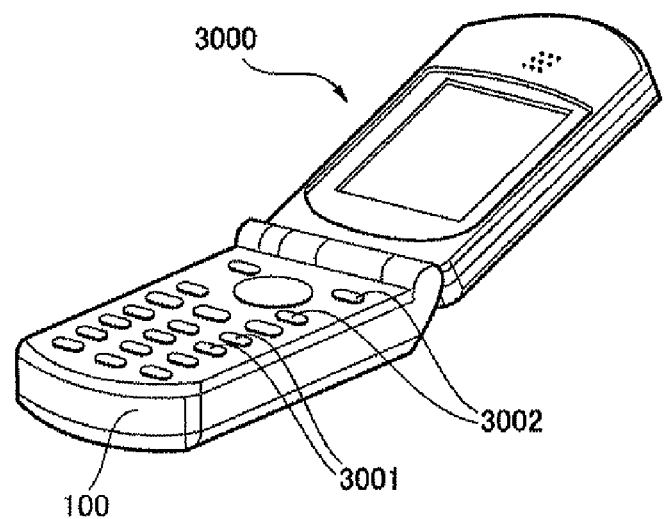
Figure 10C:
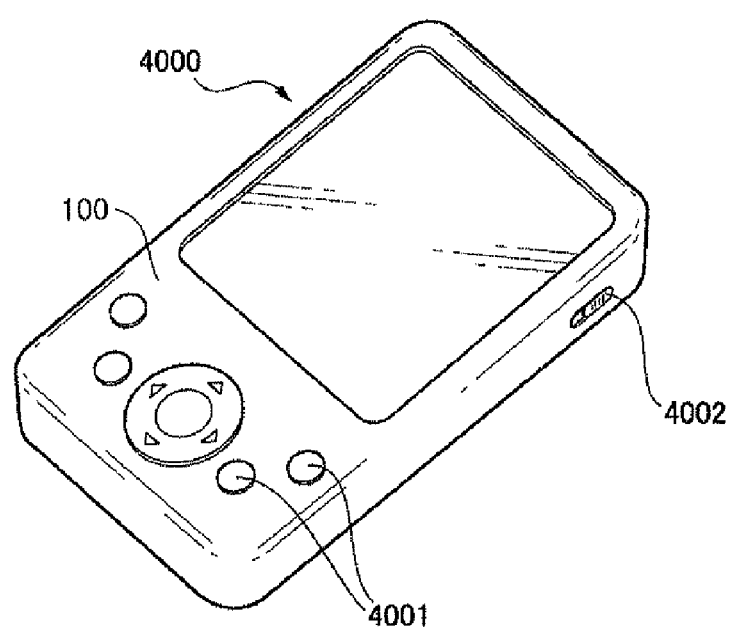

Next, electronic apparatuses including the structure described above will now be described. FIGS. 10A to 10C are schematic views for explaining examples of electronic apparatuses including the CMOS transistor 100 shown in FIGS. 1A to 1C. FIG. 10A shows a mobile type personal computer including the CMOS transistor 100. A personal computer 2000 includes the CMOS transistor 100. A main body 2010 is provided with a power source switch 2001 and a keyboard 2002. FIG. 10B shows a cellular phone including the CMOS transistor 100. A cellular phone 3000 is provided with a plurality of operation buttons 3001 and scroll buttons 3002. FIG. 10C shows a personal digital assistant (PDA) including the CMOS transistor 100. A personal digital assistant 4000 is provided with a plurality of operation buttons 4001 and a power supply switch 4002. Various information such as an address list and a schedule book are processed by the CMOS transistor 100 by operating the operation buttons 4001.

In addition to the examples shown in FIGS. 10A to 10C, examples of electronic apparatuses including the CMOS transistor 100 can include digital still cameras, liquid crystal televisions, video tape recorders of viewfinder types or monitor viewing types, car navigation devices, pagers, personal digital assistants, electric calculators, word processors, work stations, picture phones, POS terminals, and apparatuses equipped with a touch panel.

What is claimed is:

1. A semiconductor device, comprising:
   a substrate;
   a plurality of piezoelectric devices disposed on the substrate;
   a plurality of MOS transistors, a stress of a channel region of one of the plurality of MOS transistors being controlled by one of the plurality of piezoelectric devices, the channel region being included in a semiconductor layer; and
   a plurality of insulators, one of the plurality of insulators departing the channel region of the one of the plurality of MOS transistors and the one of the plurality of piezoelectric devices,
   each of the plurality of piezoelectric devices including a first electrode, a piezoelectric body, and a second electrode, a voltage being applied between the first electrode and the second electrode,
   a plurality of semiconductor layers of the plurality of MOS transistors being separately disposed on a first surface of the substrate,
   the plurality of piezoelectric bodies each corresponding to a respective one of the plurality of piezoelectric devices being separately disposed on the first surface of the substrate, and
   when viewed from a normal line of the first surface, a first electrode and a second electrode of the one of the plurality of piezoelectric devices sandwiching a piezoelectric body corresponding to the one of the plurality of piezoelectric devices toward a channel width direction of a P-channel MOS transistor of the plurality of MOS transistors, the one of the plurality of piezoelectric devices controlling the stress of the channel region of the P-channel MOS transistor, and a first electrode and a second electrode of another one of the plurality of piezoelectric devices sandwiching a piezoelectric body corresponding to the another one of the plurality of piezoelectric devices toward a thickness direction of the piezoelectric body corresponding to the another one of the plurality of piezoelectric devices, the another one of the plurality of piezoelectric devices controlling the stress of the channel region of a N-channel MOS transistor of the plurality of MOS transistors.

2. The semiconductor device according to claim 1,
   a compressive stress being applied toward a channel length direction of the semiconductor layer of the P-type MOS transistor in active state by the one of the plurality of piezoelectric devices,
   a tensile stress being applied toward the channel length direction of the semiconductor layer of the P-type MOS transistor in inactive state by the one of the plurality of piezoelectric devices,
   a tensile stress being applied toward the channel length direction of the semiconductor layer of the N-type MOS transistor in active state by the another one of the plurality of piezoelectric devices,
   a compressive stress being applied toward the channel length direction of the semiconductor layer of the N-type MOS transistor in inactive state by the another one of the plurality of piezoelectric devices.

3. An electronic apparatus, comprising:
   the semiconductor device according to claim 2.

4. An electronic apparatus, comprising:
   the semiconductor device according to claim 1.

* * * * *